United States Patent
Hu et al.

(10) Patent No.: US 9,679,260 B2
(45) Date of Patent: Jun. 13, 2017

(54) SYSTEM AND METHOD FOR ADAPTIVE FILTER

(71) Applicant: Huawei Technologies Co., Ltd., Shenzhen (CN)

(72) Inventors: Lan Hu, Ottawa (CA); Sai Mohan Kilambi, Ottawa (CA); Ming Jia, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 515 days.

(21) Appl. No.: 14/220,755

(22) Filed: Mar. 20, 2014

(65) Prior Publication Data
US 2015/0269493 A1 Sep. 24, 2015

(51) Int. Cl.
*G06N 99/00* (2010.01)
*H03H 21/00* (2006.01)

(52) U.S. Cl.
CPC ............ *G06N 99/005* (2013.01); *G06N 99/00* (2013.01); *H03H 21/0012* (2013.01); *H03H 2021/0092* (2013.01)

(58) Field of Classification Search
CPC ...................................................... G06N 99/00
See application file for complete search history.

(56) References Cited

U.S. PATENT DOCUMENTS

| 2012/0066162 | A1 | 3/2012 | Borkar et al. |
| 2013/0301844 | A1* | 11/2013 | Konchitsky ............ H04R 3/002 381/71.1 |
| 2014/0067739 | A1 | 3/2014 | Hombs et al. |

FOREIGN PATENT DOCUMENTS

| CN | 1805279 A | 7/2006 |
| CN | 102629105 A | 8/2012 |

OTHER PUBLICATIONS

R. Alexander and A. Ghirnikar, "A Method for Recursive Least Squares Filtering Based Upon an Inverse QU Decomposition", IEEE Trans. on Sig. Proces., vol. 41, No. 1, Jan. 1993, pp. 20-30.*
International Search Report of Patent Cooperastion Treaty (PCT), International Application No. PCT/CN2015/074482, Applicant Huawei Technologies Co., Ltd., date of mailing Jun. 12, 2015, 8 pages.

* cited by examiner

*Primary Examiner* — Vincent Gonzales
(74) *Attorney, Agent, or Firm* — Slater Matsil, LLP

(57) ABSTRACT

In one embodiment, a method for training an adaptive filter includes receiving, by a processor from a device, an input signal and a training reference signal and determining a correlation matrix in accordance with the input signal, the training reference signal, and a filter type. The method also includes determining a plurality of coefficients in accordance with the correlation matrix and adjusting the adaptive filter in accordance with the plurality of coefficients.

20 Claims, 2 Drawing Sheets

SYSTEM AND METHOD FOR ADAPTIVE FILTER

TECHNICAL FIELD

The present invention relates to a system and method for filtering, and, in particular, to a system and method for adaptive filtering.

BACKGROUND

Adaptive filtering is used in a variety of situations, including power amplifier predistortion systems. Predistortion is a technique which improves the linearity of power amplifiers, for example in telecommunications systems. A power amplifier with nonlinearities causes interference on other radio channels. Predistortion circuits inversely model the power amplifier's gain and phase characteristics to produce a system that is more linear. Inverse distortion is introduced into the input of the power amplifier, cancelling nonlinearities in the amplifier. The characteristics of the adaptive filter may vary by the type of power amplifier or power amplifier sub-system architecture.

An adaptive equalizer provides feedback, for example to equalize the channel gain across frequency bandwidths to compensate for different gains at different frequencies. Also, adaptive filters may be used for interference calculations in other types of adaptive systems. An adaptive filter self-adjusts its transfer function based on an optimization algorithm from an error signal. In an example, an adaptive process uses a cost function, which is a criterion for optimum performance of the filter, as an input to an optimization algorithm. The algorithm determines how to modify the filter transfer function to minimize the cost of the next iteration.

SUMMARY

An embodiment method for training an adaptive filter includes receiving, by a processor from a device, an input signal and a training reference signal and determining a correlation matrix in accordance with the input signal, the training reference signal, and a filter type. The method also includes determining a plurality of coefficients in accordance with the correlation matrix and adjusting the adaptive filter in accordance with the plurality of coefficients.

An embodiment method for training an adaptive filter includes receiving, by a processor from a device, an input signal and a training reference signal and determining a tri-angle matrix in accordance with the input signal and the training reference signal. The method also includes storing the tri-angle matrix and determining a plurality of coefficients in accordance with the tri-angle matrix. Additionally, the method includes adjusting the adaptive filter in accordance with the plurality of coefficients.

An embodiment computer includes a processor and a computer readable storage medium storing programming for execution by the processor. The programming includes instructions to receive an input signal and a training reference signal and determine a correlation matrix in accordance with the input signal, the training reference signal, and a filter type. The programming also includes instructions to determine a plurality of coefficients in accordance with the correlation matrix and adjust an adaptive filter in accordance with the plurality of coefficients.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

An embodiment uses a flexible adaptation architecture to achieve convergence in different manners and adapts quickly for different types of training targets. A common hardware architecture may be used for various training algorithms, such as least squares (LS)-GIVEN, least squares QR decomposition (LS-QRD), QR decomposition recursive least squares (QRD-RLS) or (QRD), and least mean squares (LMS). Configurable parameters include the training algorithm, the filter type, the matrix size, the number of samples for the correlation matrix calculation, the number of rows within the correlation matrix (correlation U vectors or U vector) for basic tri-angle rotation matrix calculation, multiple level adaptations with forgetting factors $\lambda_1$, $\lambda_2$, and $\lambda_3$, coefficient update parameter $\mu$, and regularization factor $\alpha$.

Figure 1:
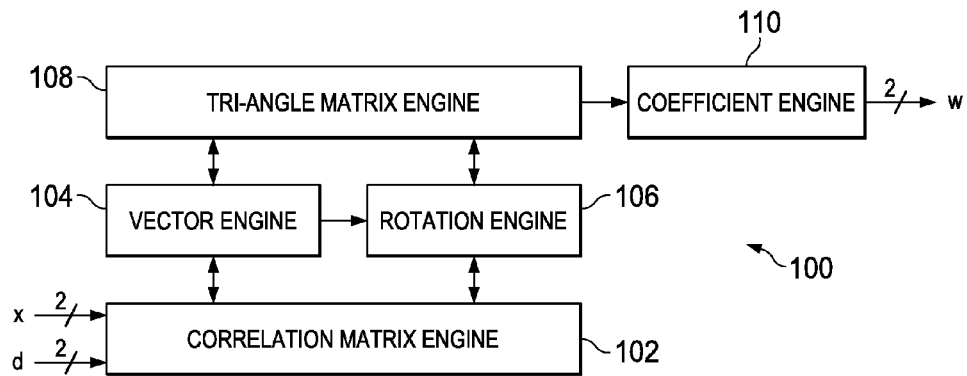
FIG. 1 illustrates an embodiment system for an adaptive filter.

FIG. 1 illustrates system 100 for adaptive filter training. Vector engine 104, rotation engine 106, and coefficient engine 110 are common to LS-GIVEN, LS-QRD, and QRD filter types. Correlation matrix engine 102 and tri-angle matrix engine 108 are programmable to facilitate LS-GIVEN, LS-QRD, QRD, and LMS architectures.

Correlation matrix engine 102 generates a U vector and a correlation matrix $R_{xd}$. In one example, the U vector is composed of the input signal x, which is the output of the pre-actuator model, when direct training is used, or the plant output when indirect training is used. The general formula for the training input U vector is a function of the input signal, and is given by:

$$U = f(x_0, x_1, \ldots, x_i),$$

where i represents the total number of training model parameters. In general, the $k^{th}$ correlation matrix is defined by the recursive relation:

$$R_{xd_k} = R_{xd_k}^b \lambda_1 R_{xd_{k-1}}. \qquad (1)$$

$R_{xd_{k-1}}$ is the $(k-1)^{th}$ correlation matrix, $\lambda_1$ is the forgetting factor of the matrix $R_{xd}$, and $R_{xd_k}^b$ is the basic correlation matrix at the $k^{th}$ correlation matrix block. The correlation matrix $R_{xd_k}^b$ is composed of the correlation matrix $U^H \times U$ and the cross correlation vector $U^H \times d$, where d is the training reference signal. That is:

$$R_{xd_k}^b = [U^H \times U U^H \times d]_{M \times (M+1)}.$$

The correlation matrix of the U vector is renamed to:

$$R_u = [U^H \times U]_{M \times M} + \alpha I_M.$$

Regularization factor $\alpha$, which is programmable, handles the matrix ill condition. The U vector matrix is given by:

$$U = \begin{bmatrix} u_0^{k \times (N-1)+i} & u_1^{k \times (N-1)+i-1} & u_2^{k \times (N-1)+i-1} & \ldots & u_{M-1}^{k \times (N-1)+i-1} \\ u_0^{k \times (N-1)+i-1} & u_1^{k \times (N-1)+i-1} & u_2^{k \times (N-1)+i-1} & \ldots & u_{M-1}^{k \times (N-1)+i-1} \\ u_0^{k \times (N-1)+i-2} & u_1^{k \times (N-1)+i-2} & u_2^{k \times (N-1)+i-2} & \ldots & u_{M-1}^{k \times (N-1)+i-2} \\ u_0^{k \times (N-1)+i-3} & u_1^{k \times (N-1)+i-3} & u_2^{k \times (N-1)+i-3} & \ldots & u_{M-1}^{k \times (N-1)+i-3} \\ \vdots & \vdots & \vdots & \ddots & \vdots \\ u_0^{k \times (N-1)+i-N+1} & u_1^{k \times (N-1)+i-N+1} & u_2^{k \times (N-1)+i-N+1} & \ldots & u_{M-1}^{k \times (N-1)+i-N+1} \end{bmatrix}_{N \times M}.$$

M is the number of coefficients, the superscript i is the $i^{th}$ sample within the $k^{th}$ correlation matrix, and N is the number of samples to be used for the correlation matrix calculation. The number of samples, N to be used for the $R_{xd}$ matrix calculation may be programmable. The cross correlation vector of U and d is given by:

$$R_d = [U^H \times d]_{N \times 1},$$

where d is the training reference signal. In a direct learning algorithm, d is the error signal between the actuator input signal and the feedback signal. For indirect learning, d is the actuator output signal given by:

$$d = \begin{bmatrix} d^{k \times (N-1)+i} \\ d^{k \times (N-1)+i-1} \\ \vdots \\ d^{k \times (N-1)+i-N+1} \end{bmatrix}_{N \times 1}.$$

For QRD and LMS algorithms, the correlation matrix $R_{ud_k}$ equals the U vector matrix and d vector, with $R_{ud_k}$ given by:

$$\begin{bmatrix} u_0^{k \times (N-1)+i} & u_1^{k \times (N-1)+i} & u_2^{k \times (N-1)+i} & \ldots & u_{M-1}^{k \times (N-1)+i} & d^{k \times (N-1)+i} \\ u_0^{k \times (N-1)+i-1} & u_1^{k \times (N-1)+i-1} & u_2^{k \times (N-1)+i-1} & \ldots & u_{M-1}^{k \times (N-1)+i-1} & d^{k \times (N-1)+i-1} \\ u_0^{k \times (N-1)+i-2} & u_1^{k \times (N-1)+i-2} & u_2^{k \times (N-1)+i-2} & \ldots & u_{M-1}^{k \times (N-1)+i-2} & d^{k \times (N-1)+i-2} \\ u_0^{k \times (N-1)+i-3} & u_1^{k \times (N-1)+i-3} & u_2^{k \times (N-1)+i-3} & \ldots & u_{M-1}^{k \times (N-1)+i-3} & d^{k \times (N-1)+i-3} \\ \vdots & \vdots & \vdots & \ddots & \vdots & \vdots \\ u_0^{k \times (N-1)+i-M+1} & u_1^{k \times (N-1)+i-M+1} & u_2^{k \times (N-1)+i-M+1} & \ldots & u_{M-1}^{k \times (N-1)+i-M+1} & d^{k \times (N-1)+i-M+1} \end{bmatrix}_{M \times (M+1)}$$

Vector engine 104 calculates diagonal R elements for tri-angle matrix engine 108 and rotation matrix $G_n$ for rotation engine 106. For the $n^{th}$ rotation, the rotation matrix $G_n$ is defined by:

$$G_n = \begin{bmatrix} c_n & s_n^* \\ -s_n & c_n \end{bmatrix},$$

where $c_n$ is given by:

$$c_n = \frac{r_{n-1}^j(n, n)}{\sqrt{r_{n-1}^j(n, n)^2 + |u_{n-1}^j(n)|^2}},$$

and $s_n$ is given by:

$$s_n = \frac{u_{n-1}^j(n)}{\sqrt{r_{n-1}^j(n, n)^2 + |u_{n-1}^j(n)|^2}}.$$

The diagonal elements of the $R_{ud}$ matrix are then calculated by:

$$r_n^j = \begin{bmatrix} c_n & s_n^* \end{bmatrix} \begin{bmatrix} r_{n-1}^j(n, n) \\ u_{n-1}^j(n) \end{bmatrix} = \sqrt{r_{n-1}^j(n, n)^2 + |u_{n-1}^j(n)|^2}.$$

Rotation engine 106 calculates the rest of the elements in tri-angle matrix $R_{ud}$. The additional elements include $r_n^k(i,j)$ and $z_n^k(i)$. These additional elements may be obtained by:

$$\begin{bmatrix} x_n \\ y_n \end{bmatrix} = G_n \begin{bmatrix} x_{n-1} \\ y_{n-1} \end{bmatrix}.$$

Tri-angle matrix engine 108 implements tri-angle matrix $R_{ud}$. The tri-angle matrix engine stores intermediate and final tri-angle matrix results. The general recursive $j^{th}$ tri-angle matrix is given by:

$$R_{ud_j} = R_{ud_j}^b + \lambda_3 \times R_{ud_{j-1}},$$

where $R_{ud_j}^b$ is the basic tri-angle matrix. The basic tri-angle matrix is represented by:

$$R_{ud_j}^b = \lambda_2 \times R_{ud_{j-1}}^b.$$

The initial basic tri-angle matrix is configured based on the filter type. For LS-GIVEN, the initial tri-angle matrix equals the correlation matrix $R_{xd_k}$. In LS-GIVEN's rotation, the rotation is performed on the full correlation matrix. In the LS-QRD and QRD, the basic tri-angle matrix is given by:

$$R_{ud_0}^b = \begin{bmatrix} 1 & 0 & 0 & \cdots & 0 & 0 \\ 0 & 1 & 0 & \cdots & 0 & 0 \\ 0 & 0 & 1 & \cdots & 0 & 0 \\ \vdots & \vdots & \vdots & \ddots & \vdots & \vdots \\ 0 & 0 & 0 & \cdots & 1 & 0 \end{bmatrix}_{M \times (M+1)}$$

For QRD or LS-QRD, rotation is performed on a single row or a block row within the correlation matrix. After i rotations, the tri-angle matrix becomes:

$$R_{ud_j} = \begin{bmatrix} r_{u_{11}}^j & r_{u_{12}}^j & r_{u_{13}}^j & \cdots & r_{u_{1M}}^j & r_{d_1}^j \\ 0 & r_{u_{22}}^j & r_{u_{23}}^j & \cdots & r_{u_{2M}}^j & r_{d_2}^j \\ 0 & 0 & r_{u_{33}}^j & \cdots & r_{u_{34}}^j & r_{d_3}^j \\ \vdots & \vdots & \vdots & \ddots & \vdots & \vdots \\ 0 & 0 & 0 & \cdots & r_{u_{MM}}^j & r_{d_M}^j \end{bmatrix}_{M \times (M+1)}.$$

For the LMS configuration, the tri-angle matrix is not used. Tri-angle matrix engine block 108 may be disabled, and the memory used for storing tri-angle matrix elements may be assigned to extend the size of the correlation matrix.

Coefficient engine 110 performs back substitution and updates the coefficients. The coefficient calculation and update are based on the matrix update configuration. This may be performed on a single U vector, a basic block, or several basic blocks based on the algorithm chosen and the training system requirements. Table 1 below illustrates various matrix update configurations.

TABLE 1

| Algorithm | Matrix Update Correlation Matrix | Tri-angle Matrix | Description |
|---|---|---|---|
| LS-GIVEN's | Single basic block | Basic Rotation Matrix | Matrix rotation and coefficient calculation are based on a basic Correlation Matrix and basic Tri-angle Matrices $\lambda_1$ and $\lambda_3 = 0$; $\lambda_2 = 1$ |
| | | Multiple basic Rotation Matrices | Coefficient calculation is based on a basic Correlation Matrix and multiple basic Tri-angle Matrices $\lambda_1 = 0$, $\lambda_3 = (0, 1]$; $\lambda_2 = 1$ |
| | Multiple basic blocks | Basic Rotation Matrix | Matrix rotation and coefficient calculation are based on multiple basic Correlation Matrices and a basic Tri-angle Matrix $\lambda_1 = (0, 1]$; $\lambda_2 = 1$; $\lambda_3 = 0$ |
| | | Multiple Basic Rotation Matrices | Matrix rotation and coefficient calculation are based on multiple basic Correlation Matrices and multiple basic Tri-angle Matrices $\lambda_1 = (0, 1]$; $\lambda_2 = 1$; $\lambda_3 = (0, 1]$ |
| LS-QRD | Partial basic block | Basic Rotation Matrix | Matrix rotation and coefficient calculation are based on several rows within a basic Correlation Matrix or multiple Correlation Matrices and a basic Tri-angle Matrix $\lambda_1 = 0$; $\lambda_3 = 0$; $\lambda_2 = (0, 1]$ |
| | | Multiple Basic Rotation | Matrix rotation and coefficient calculation are based on several rows within a basic Correlation Matrix or multiple Correlation |

TABLE 1-continued

| Algorithm | Correlation Matrix | Tri-angle Matrix | Description |
|---|---|---|---|
| | | Matrices | Matrices and multiple basic Tri-angle Matrices $\lambda_1 = 0; \lambda_3 = (0, 1]; \lambda_2 = (0, 1]$ |
| | Single basic block | Basic Rotation Matrix | Matrix rotation and coefficient calculation are based on all rows of a basic Correlation Matrix and a basic Tri-angle Matrix $\lambda_1 = 0; \lambda_3 = 0; \lambda_2 = (0, 1]$ |
| | | Multiple Basic Rotation Matrices | Matrix rotation and coefficient calculation are based on all rows of a basic Correlation Matrix and multiple basic Tri-angle Matrices $\lambda_1 = 0; \lambda_3 = (0, 1]; \lambda_2 = (0, 1]$ |
| | Multiple basic blocks | Basic Rotation Matrix | Matrix rotation and coefficient calculation are based on all rows of multiple basic Correlation Matrices and a basic Tri-angle Matrix $\lambda_1 = (0, 1]; \lambda_3 = 0; \lambda_2 = (0, 1]$ |
| | | Multiple Basic Rotation Matrices | Matrix rotation and coefficient calculation are based on all rows of multiple basic Correlation Matrices and multiple basic Tri-angle Matrices $\lambda_1 = (0,1]; \lambda_3 = (0, 1]; \lambda_2 = (0, 1]$ |
| QRD | Single U vector | Basic Rotation Matrix | Matrix rotation and coefficient calculation are based on single rows of multiple basic Correlation Matrix and a basic Tri-angle Matrix $\lambda_1 = 0; \lambda_3 = 0; \lambda_2 = (0, 1]$ |
| | | Multiple Basic Rotation Matrices | Matrix rotation and coefficient calculation are based on a single row of a multiple basic Correlation Matrices and multiple basic Tri-angle Matrices $\lambda_1 = 0; \lambda_3 = (0, 1]; \lambda_2 = (0, 1]$ |
| LMS | Single U vector | N/A | Coefficient calculation and update is based on a single U vector within a Single Basic Correlation Matrix (sample by sample update) $\lambda_1 = 0; \lambda_3 = N/A; \lambda_2 = N/A$ |
| | Single basic block | N/A | Several or all U vectors within Single Basic Correlation Matrix are used for coefficient calculation and update (Block based update) $\lambda_1 = 0; \lambda_3 = N/A; \lambda_2 = N/A$ |

For LS-GIVEN, a single basic block correlation matrix or multiple basic block correlation matrices may be used. With either a single basic block correlation matrix or multiple basic block matrices, the tri-angle matrix may be a basic rotation matrix or multiple basic rotation matrices. In a basic rotation matrix, the matrix rotation and coefficient calculation are based on the basic correlation matrix and the basic tri-angle matrix. In basic rotation, $\lambda_1=0, \lambda_2=1$, and $\lambda_3=0$. For multiple basic rotation matrices, calculations are based on the basic correlation matrix and multiple basic tri-angle matrices, where $\lambda_1=0, \lambda_2=1$, and $\lambda_3=(0, 1]$. When multiple basic blocks are used for the correlation matrix, a basic rotation matrix or multiple basic rotation matrix may be used for the tri-angle matrix. For a basic rotation matrix as the tri-angle matrix, matrix rotation and coefficient calculation are based on multiple basic correlation matrices, and the basic tri-angle matrix, where $\lambda_1=(0, 1], \lambda_2=1$, and $\lambda_3=0$. For multiple basic rotation matrix, the matrix rotation and coefficient calculation are based on multiple basic correlation matrices, and multiple basic tri-angle matrices, and $\lambda_1=(0, 1], \lambda_2=1$, and $\lambda_3=(0, 1]$.

In an example with a LS-QRD filter, the correlation matrix may be a partial basic block matrix, a single basic block matrix, or multiple basic block matrices. The tri-angle matrix may be a basic rotation matrix or multiple basic rotation matrices. There may be any combination of correlation matrix and tri-angle matrix. When a partial basic block correlation matrix is used with a basic rotation tri-angle matrix, matrix rotation and coefficient calculation are based on several rows within a basic correlation matrix or multiple correlation matrices and the basic tri-angle matrix, where $\lambda_1=0, \lambda_2=(0, 1]$, and $\lambda_3=0$. On the other hand, when a partial basic block correlation matrix is used with multiple basic rotation tri-angle matrices, matrix rotation and coefficient calculation are based on several rows within a basic correlation matrix or multiple correlation matrices and multiple basic tri-angle matrices, where $\lambda_1=0, \lambda_2=(0, 1]$, and $\lambda_3=(0, 1]$. Also, when a single basic block correlation matrix is used with a basic rotation tri-angle matrix, the matrix rotation and coefficient calculation are based on all rows of the basic correlation matrix and the basic tri-angle matrix, where $\lambda_1=0, \lambda_2=(0, 1]$, and $\lambda_3=0$. When a single basic block correlation matrix is used with multiple basic rotation matrices, the matrix rotation and coefficient calculation are based on all rows of a basic correlation matrix and multiple basic rotation matrices, where $\lambda_1=0, \lambda_2=(0, 1]$, and $\lambda_3=(0, 1]$. Additionally, when multiple basic block correlation matrices and a basic rotation tri-angle matrix are used, the matrix rotation and coefficient calculations are based on all rows of multiple basic correlation matrices and a basic tri-angle matrix, where $\lambda_1=(0, 1], \lambda_2=(0, 1]$, and $\lambda_3=0$. When multiple basic block correlation matrices are used with multiple basic rotation tri-angle matrices, matrix rotation and coefficient calculations are based on all rows of multiple basic correlation matrices and multiple basic tri-angle matrices, with $\lambda_1=(0, 1], \lambda_2=(0, 1]$, and $\lambda_3=(0, 1]$.

In another example, a QRD filter is used, and the correlation matrix is a single U vector matrix. The tri-angle matrix may be a basic rotation matrix or multiple basic rotation matrices. When a basic rotation matrix is use as the tri-angle matrix, the matrix rotation and coefficient calculations are based on single rows of multiple basic correlation matrices and a basic tri-angle matrix, where $\lambda_1=0, \lambda_2=(0, 1]$, and $\lambda_3=0$. On the other hand, when the multiple basic rotation matrices are used, the matrix rotation and coefficient calculations are based on a single row of multiple basic correlation matrix and multiple basic tri-angle matrices, where $\lambda_1=0, \lambda_2=(0, 1]$, and $\lambda_3=(0, 1]$.

With an LMS filter, the correlation matrix may be a single U vector matrix or a single basic block matrix. There is no tri-angle matrix for LMS. When the correlation matrix is a single U vector, the coefficient calculation and update is based on a single U vector with a single basic correlation matrix for a sample by sample update, where $\lambda_1=0$, and $\lambda_2$ and $\lambda_3$ are not applicable. When a single basic block correlation matrix is used, some or all of the U vectors within a single basic correlation matrix are used for the calculation and update, with block based updating, where $\lambda_1=0$, and $\lambda_2$ and $\lambda_3$ are not applicable.

Figure 2:
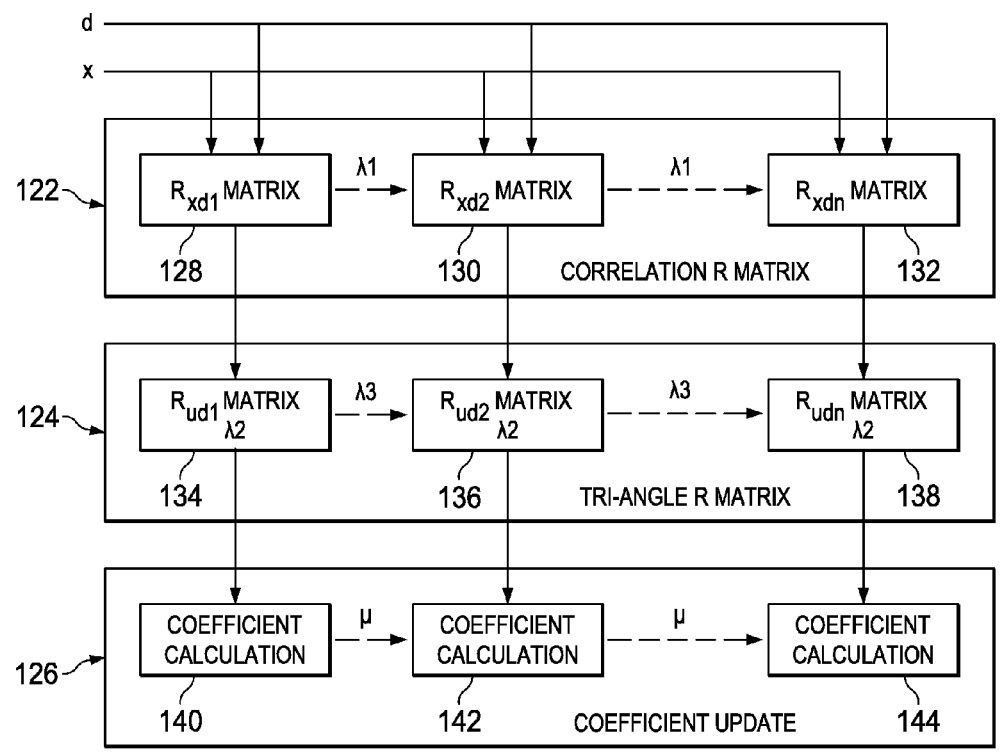
FIG. 2 illustrates a flowchart for an embodiment method for adaptive filtering.

FIG. 2 illustrates the relationship of the matrix and the coefficient update. The number of rows in the correlation matrix used for matrix rotation depends on the training algorithm. For LS-GIVEN, all rows within the correlation matrix are used for matrix rotation, while for LS-QRD or QRD, a single row or a block of rows may be used for matrix rotation, depending on the configuration. On the other hand, for LMS, the tri-angle matrix is not used, and coefficient update may be based on single or block U vectors. A variety of different step sizes may be used. Smaller steps are slower, but perform better than bigger steps. Multiple step sizes and multiple matrix sizes may be used adaptively.

In block 122, the correlation matrix is generated. $\lambda_1$ is forgetting factor used for the correlation matrix calculation as defined in Equation (1). When $\lambda_1$ is zero, the current correlation matrix $R_{xdi}$ is calculated without basing itself on previous correlation matrix information. At a given time i, the correlation matrix, $R_{xdi}$, may be calculated independently or based on partial correlation matrix information from the previous iteration weighted by the forgetting factor.

Then, in block 124, $\lambda_2$ is the forgetting factor for individual tri-angle matrix, and $\lambda_3$ is the forgetting factor between tri-angle matrices. At a given time, the tri-angle matrix, $R_{xdi}$ may be calculated independently or based on partial information of the previous triangle matrix $R_{xdi-1}$ weighted by the corresponding forgetting factor value.

Finally, in block 126, the coefficients are updated. In block 140, the coefficient is calculated from the tri-angle matrix. Note that μ is the coefficient forgetting factor. At a given time i (or sample), the coefficients may be calculated independently or based on weighted coefficients of the previous iteration. Depending on the configuration, the coefficient may not be applied to the actuator in the current iteration i.e. multiple iterations can happen before a coefficient update is applied.

Figure 3:
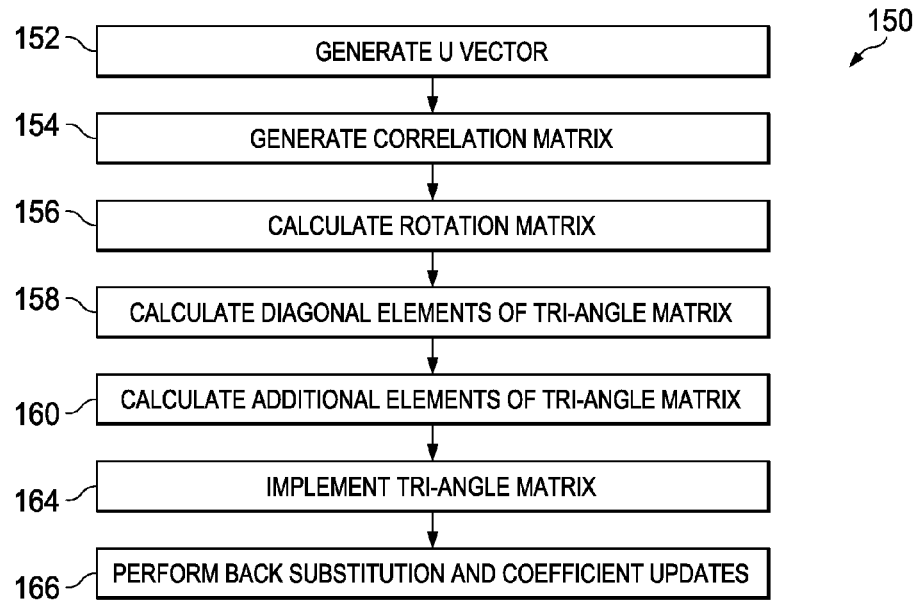
FIG. 3 illustrates another flowchart for an embodiment method of adaptive filtering.

FIG. 3 illustrates flowchart 150 for an adaptive filtering method. Initially, in step 152, U vectors are generated. In one example, direct training is used, and the U vector is composed of the input signal x from the actuator output. Alternatively, when indirect training is used, the U vector is composed of the output of the target plant. The general formula for the training input U vector is given by:

$$U=f(x_0, x_1, \ldots, x_i),$$

where i is an integer indicating the number of training model parameters.

Next, in step 154, the correlation matrix is generated. In general, the $k^{th}$ correlation matrix is defined by the recursive relation:

$$R_{xd_k} = R_{xd_k}^b + \lambda_1 R_{xd_{k-1}}.$$

$R_{xd_{k-1}}$ is the $(k-1)^{th}$ correlation matrix, $\lambda_1$ is the forgetting factor of the matrix $R_{xd}$, and $R_{xd_k}^b$ is the basic correlation matrix at the $k^{th}$ correlation matrix block. The correlation matrix $R_{xd_k}^b$ is composed of the correlation matrix $U^H \times U$ and the cross correlation vector $U^H \times d$.

Then, in step 156, rotation matrix $G_n$ is calculated. For the $n^{th}$ rotation, the rotation matrix $G_n$ is defined by:

$$G_n = \begin{bmatrix} c_n & s_n^* \\ -s_n & c_n \end{bmatrix},$$

where $c_n$ is given by:

$$c_n = \frac{r_{n-1}^j(n, n)}{\sqrt{r_{n-1}^j(n, n)^2 + |u_{n-1}^j(n)|^2}},$$

and $s_n$ is given by:

$$s_n = \frac{u_{n-1}^j(n)}{\sqrt{r_{n-1}^j(n, n)^2 + |u_{n-1}^j(n)|^2}}.$$

In step 158, the diagonal elements of the tri-angle matrix are calculated. For instance, the diagonal elements of the tri-angle matrix may be calculated according to the formula:

$$r_n^j = \begin{bmatrix} c_n & s_n^* \end{bmatrix} \begin{bmatrix} r_{n-1}^j(n, n) \\ u_{n-1}^j(n) \end{bmatrix} = \sqrt{r_{n-1}^j(n, n)^2 + |u_{n-1}^j(n)|^2}.$$

The remaining elements of the tri-angle matrix are calculated in step 160. The additional elements include $r_n^k(i,j)$ and $z_n^k(i)$. These additional elements may be calculated, for example by:

$$\begin{bmatrix} x_n \\ y_n \end{bmatrix} = G_n \begin{bmatrix} x_{n-1} \\ y_{n-1} \end{bmatrix}.$$

Next, in step 164, the tri-angle matrix is implemented. The tri-angle matrix engine stores the intermediate and final tri-angle matrix results. The initial basic tri-angle matrix is configured based on the filter type. For LS-GIVEN, the initial tri-angle matrix equals the correlation matrix $R_{xd_k}$. On the other hand, LS-GIVEN's rotation is performed on the full correlation matrix. In another example with QRD or LS-QRD, rotation is performed on a single row or a block row within the correlation matrix. For the LMS configuration, the tri-angle matrix is not used. Tri-angle matrix engine block 108 may be disabled, and the memory used for storing tri-angle matrix elements may be assigned to extend the size of the correlation matrix.

Finally, in step 166, back substitution and coefficient updates are performed. The coefficient calculation and update are based on the matrix update configuration. This may be performed on a single U vector, a basic block, or several basic blocks based on the algorithm chosen and the training system requirements.

Embodiments may have a variety of physical implementations. For example, a field programmable gate array (FPGA), application specific integrated circuit (ASIC), digital signal processor, or general purpose computer may be used. These are all considered as examples of the general category of processor.

Figure 4:
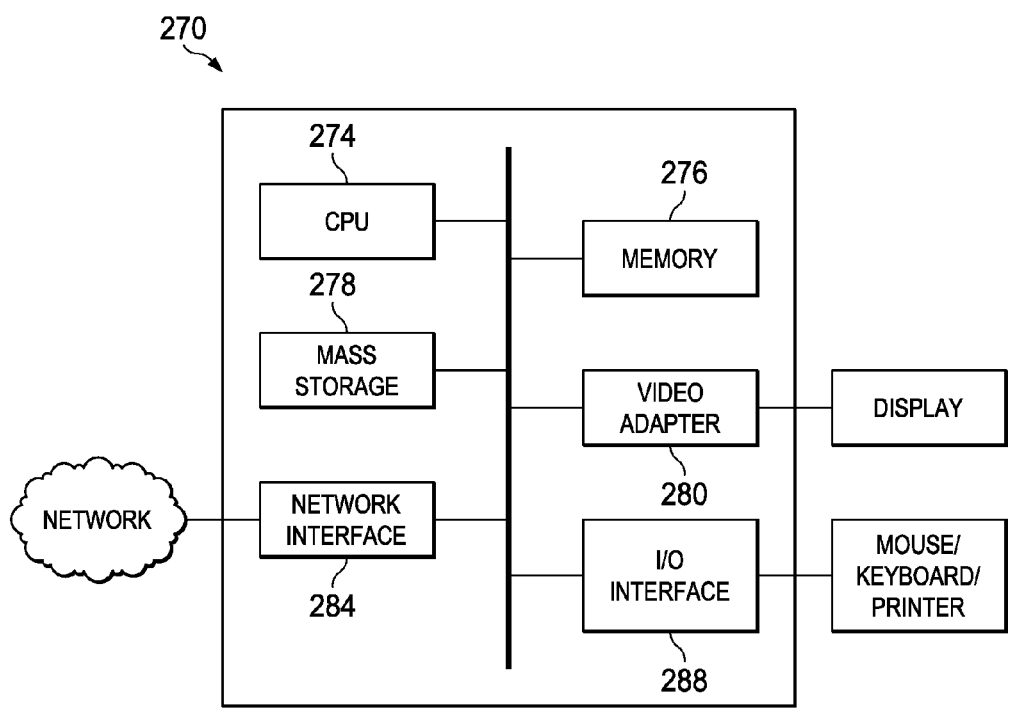
FIG. 4 illustrates a block diagram of an embodiment general-purpose computer system.

FIG. 4 illustrates a block diagram of processing system 270 that may be used for implementing the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input devices, such as a microphone, mouse, touchscreen, keypad, keyboard, and the like. Also, processing system 270 may be equipped with one or more output devices, such as a speaker, a printer, a display, and the like. The processing unit may include central processing unit (CPU) 274, memory 276, mass storage device 278, video adapter 280, and I/O interface 288 connected to a bus.

The bus may be one or more of any type of several bus architectures including a memory bus or memory controller, a peripheral bus, video bus, or the like. CPU 274 may comprise any type of electronic data processor. Memory 276 may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

Mass storage device 278 may comprise any type of storage device configured to store data, programs, and other information and to make the data, programs, and other information accessible via the bus. Mass storage device 278 may comprise, for example, one or more of a solid state drive, hard disk drive, a magnetic disk drive, an optical disk drive, or the like.

Video adaptor 280 and I/O interface 288 provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface card (not pictured) may be used to provide a serial interface for a printer.

The processing unit also includes one or more network interface 284, which may comprise wired links, such as an Ethernet cable or the like, and/or wireless links to access nodes or different networks. Network interface 284 allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method for training an adaptive filter, the method comprising:
    selecting a filter type from the group consisting of least squares (LS)-GIVEN, least squares QR decomposition (LS-QRD), QR decomposition recursive least squares (QRD), and least mean squares (LMS);
    receiving, by a processor from a device, an input signal x and a training reference signal d;
    determining, by the processor, a correlation matrix $R_{xd}$ in accordance with the input signal x, the training reference signal d, and the selected filter type;
    determining, by the processor, a plurality of coefficients for the adaptive filter in accordance with the correlation matrix $R_{xd}$;
    adjusting, by the processor, the adaptive filter in accordance with the plurality of coefficients; and
    predistorting an input of a power amplifier utilizing the adjusted adaptive filter.

2. The method of claim 1, further comprising determining a U vector, wherein determining the correlation matrix $R_{xd}$ further comprises determining the correlation matrix $R_{xd}$ in accordance with the U vector.

3. The method of claim 2, wherein determining the U vector comprises determining the U vector in accordance with the input signal x and the filter type.

4. The method of claim 2, wherein determining the U vector comprises determining the U vector in accordance with the training reference signal d and the filter type.

5. The method of claim 2, further comprising determining a size of the U vector.

6. The method of claim 1, further comprising determining a size of the correlation matrix $R_{xd}$.

7. The method of claim 1, further comprising:
    determining a first forgetting factor $\lambda_1$ in accordance with the filter type;
    determining a second forgetting factor $\lambda_2$ in accordance with the filter type; and
    determining a third forgetting factor $\lambda_3$ in accordance with the filter type, wherein determining the correlation matrix $R_{xd}$ further comprises determining the correlation matrix $R_{xd}$ in accordance with the first forgetting factor $\lambda_1$, the second forgetting factor $\lambda_2$, and the third forgetting factor $\lambda_3$.

8. The method of claim 1, further comprising determining a regularization factor $\alpha$, wherein determining the correlation matrix $R_{xd}$ further comprises determining the correlation matrix $R_{xd}$ in accordance with the regularization factor $\alpha$.

9. The method of claim 1, wherein the correlation matrix $R_{xd}$ consists of a basic block correlation matrix.

10. The method of claim 1, wherein the correlation matrix $R_{xd}$ comprises:
    a first basic block correlation matrix; and
    a second basic block correlation matrix.

11. The method of claim 1, wherein the correlation matrix $R_{xd}$ comprises a partial basic block correlation matrix.

12. The method of claim 1, wherein the correlation matrix $R_{xd}$ comprises a U vector.

13. A method for training an adaptive filter, the method comprising:
- selecting a filter type from the group consisting of least squares (LS)-GIVEN, least squares QR decomposition (LS-QRD), and QR decomposition recursive least squares (QRD);
- receiving, by a processor from a device, an input signal x and a training reference signal d;
- determining, by the processor, a tri-angle matrix $R_{ud}$ in accordance with the input signal x, the training reference signal d, and the selected filter type;
- storing, by the processor, the tri-angle matrix $R_{ud}$;
- determining, by the processor, a plurality of coefficients for the adaptive filter in accordance with the tri-angle matrix $R_{ud}$;
- adjusting, by the processor, the adaptive filter in accordance with the plurality of coefficients; and
- predistorting an input of a power amplifier utilizing the adjusted adaptive filter.

14. The method of claim 13, wherein determining the tri-angle matrix $R_{ud}$ comprises:
- determining a first plurality of diagonal elements of the tri-angle matrix $R_{ud}$; and
- determining a second plurality of non-diagonal elements of the tri-angle matrix $R_{ud}$.

15. The method of claim 14, wherein determining the second plurality of non-diagonal elements comprises determining a rotation matrix.

16. The method of claim 13, further comprising determining a size of the tri-angle matrix $R_{ud}$.

17. The method of claim 13, further comprising determining a coefficient forgetting factor μ, wherein determining the plurality of coefficients for the adaptive filter comprises determining the plurality of coefficients in accordance with the coefficient forgetting factor μ.

18. The method of claim 13, wherein the tri-angle matrix $R_{ud}$ consists of a basic rotation matrix.

19. The method of claim 13, wherein the tri-angle matrix $R_{ud}$ comprises:
- a first basic tri-angle matrix $R_{ud_j}^b$; and
- a previous tri-angle matrix $R_{ud_{j-1}}$.

20. A power amplifier predistortion system comprising:
- a processor; and
- a computer readable storage medium storing programming for execution by the processor, the programming including instructions to:
  - selecting a filter type from the group consisting of least squares (LS)-GIVEN, least squares QR decomposition (LS-QRD), QR decomposition recursive least squares (QRD), and least mean squares (LMS);
  - receive an input signal x and a training reference signal d,
  - determine a correlation matrix $R_{xd}$ in accordance with the input signal x, the training reference signal d, and the selected filter type,
  - determine a plurality of coefficients for an adaptive filter in accordance with the correlation matrix $R_{xd}$,
  - adjust the adaptive filter in accordance with the plurality of coefficients; and
  - predistort an input of a power amplifier utilizing the adjusted adaptive filter.

* * * * *